(12) United States Patent
Chen

(10) Patent No.: US 8,558,394 B1
(45) Date of Patent: Oct. 15, 2013

(54) CHIP STACK STRUCTURE AND MANUFACTURING METHOD THEREOF

(71) Applicant: Macronix International Co., Ltd., Hsinchu (TW)

(72) Inventor: Shih-Hung Chen, Jhudong Township, HsinChu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/859,783

(22) Filed: Apr. 10, 2013

Related U.S. Application Data

(63) Continuation-in-part of application No. 13/597,669, filed on Aug. 29, 2012.

(60) Provisional application No. 61/776,890, filed on Mar. 12, 2013.

(51) Int. Cl.
*H01L 23/50* (2006.01)
*H01L 23/48* (2006.01)
*H01L 29/40* (2006.01)

(52) U.S. Cl.
USPC .................. 257/777; 257/E23.097; 257/686; 257/712; 438/108; 438/109; 361/760

(58) Field of Classification Search
USPC ........... 257/E23.097, E25.018, E25.013, 621, 257/667, 685, 686, 712, 777; 438/108, 109, 438/667, 675; 361/760
See application file for complete search history.

(56) References Cited

U.S. PATENT DOCUMENTS

| | | | | |
|---|---|---|---|---|
| 5,655,290 | A * | 8/1997 | Moresco et al. | 29/830 |
| 6,124,631 | A * | 9/2000 | Cardot et al. | 257/667 |
| 6,131,255 | A * | 10/2000 | Atkins et al. | 29/25.01 |
| 6,278,181 | B1 * | 8/2001 | Maley | 257/712 |
| 6,579,743 | B2 * | 6/2003 | Clevenger et al. | 438/105 |
| 6,620,638 | B1 * | 9/2003 | Farrar | 438/14 |
| 6,975,027 | B2 * | 12/2005 | Farrar et al. | 257/712 |
| 7,015,572 | B2 * | 3/2006 | Yamaji | 257/686 |
| 7,030,486 | B1 * | 4/2006 | Marshall | 257/712 |
| 7,936,058 | B2 * | 5/2011 | Hasegawa | 257/686 |
| 8,358,016 | B2 * | 1/2013 | Suh et al. | 257/777 |
| 8,487,427 | B2 * | 7/2013 | Bernstein et al. | 257/714 |

* cited by examiner

*Primary Examiner* — Chris Chu
(74) *Attorney, Agent, or Firm* — McClure, Qualey & Rodack, LLP

(57) ABSTRACT

A chip stack structure and a manufacturing method thereof are provided. The chip stack structure comprises a plurality of chips, a vertical conductive line, a plurality of insulating films and a fluid. The chips are overlapped. The vertical conductive line is electrically connected to some of the chips. The vertical conductive line is disposed at the outside of a projection area of some of the chips. Each chip is disposed in one of the insulating films. The channels which are hollow are formed in one of the insulating films. The fluid is disposed in the channels.

13 Claims, 15 Drawing Sheets

CHIP STACK STRUCTURE AND MANUFACTURING METHOD THEREOF

This is a Continuation-in-part application of U.S. application Ser. No. 13/597,669, filed Aug. 29, 2012, the subject matter of which is incorporated herein by reference. This application claims the benefit of U.S. provisional application Ser. No. 61/776,890, filed Mar. 12, 2013, the disclosure of which is incorporated by reference herein in its entirety.

BACKGROUND OF THE INVENTION

1. Field of the Invention

The invention relates in general to a stack structure and manufacturing method thereof, and more particularly to a chip stack structure and manufacturing method thereof.

2. Description of the Related Art

With the development of semiconductor technology, varied semiconductor elements have been invented. For example, semiconductor elements include memory, microprocessor, sensing chip and MEMS. The semiconductor elements have different functions. Some semiconductor elements are disposed on a package substrate to be formed a semiconductor package. Each semiconductor package is soldered and disposed on a printed circuit board, such that those semiconductor elements can perform varied functions thereof.

Because the current trend of electric product is towards "light, thin, short and small", the electric product is getting smaller and smaller. For reducing the volume of the electric product, the package technology is improved for reducing the volume of the semiconductor package.

SUMMARY OF THE INVENTION

The invention is directed to a chip stack structure and a manufacturing method thereof. A vertical conductive line disposed at the outside of a projection area of chips is used to form the chip stack structure.

According to a first aspect of the present invention, a chip stack structure is provided. The chip stack structure comprises a plurality of chips, a vertical conductive line, a plurality of insulating films and a fluid. The chips are overlapped. The vertical conductive line is electrically connected to some of the chips. The vertical conductive line is disposed at the outside of a projection area of some of the chips. Each chip is disposed in one of the insulating films. The channels which are hollow are formed in one of the insulating films. The fluid is disposed in the channels.

According to a second aspect of the present invention, a manufacturing method of a chip stack structure is provided. The manufacturing method comprises the following steps. A carrier is provided. A plurality of chips are provided. A vertical conductive line is formed. The vertical conductive line is disposed at the outside of a projection area of one of the chips. The chips are stacked. The vertical conductive line is electrically connecting some of the chips. A plurality of insulating films are formed. One of the insulating films is disposed on the carrier. Each chip is disposed in one of the insulating films. A plurality of channels which are hollow are formed in one of the insulating films. A fluid is disposed in the channels.

The invention will become apparent from the following detailed description of the preferred but non-limiting embodiments. The following description is made with reference to the accompanying drawings.

DETAILED DESCRIPTION OF THE INVENTION

Preferred embodiments are disclosed below for elaborating the invention. A vertical conductive line disposed at the outside of a projection area of chips is used to form a chip stack structure. The following embodiments are for the purpose of elaboration only, not for limiting the scope of protection of the invention. Besides, secondary elements are omitted in the following embodiments to highlight the technical features of the invention.

First Embodiment

Figure 1:
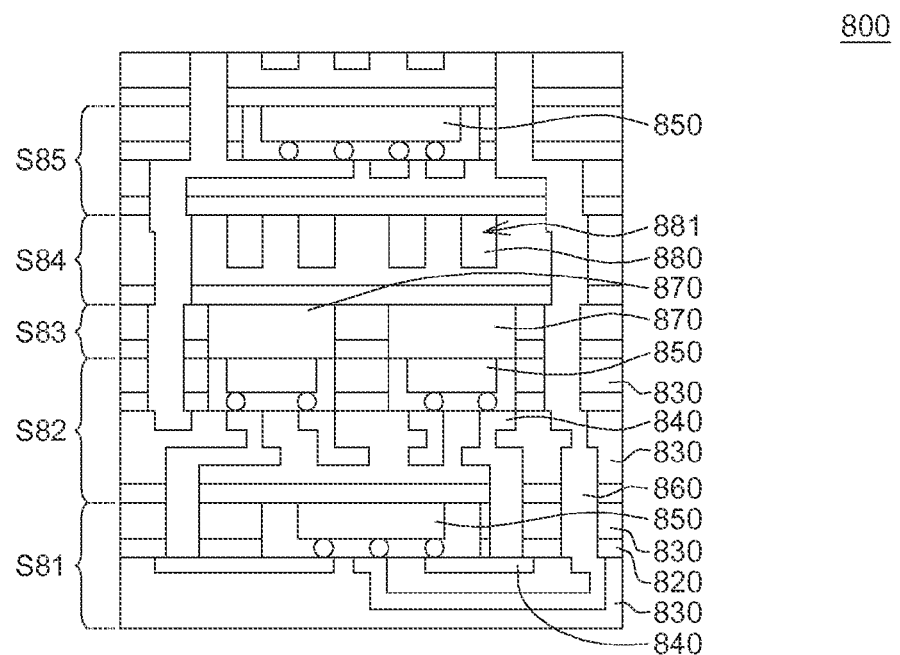
FIG. 1 shows a chip stack structure.

Please referring to FIG. 1, FIG. 1 shows a chip stack structure 800. The chip stack structure 800 includes a plurality of chips 810 and a vertical connective line 860. The chips 810 are overlapped, such that the size of the chip stack structure 800 can be reduced. The vertical conductive line 860 is electrically connected to some of the chips 810. In the present embodiments, the vertical conductive line 860 is disposed at the outside of a projection area of some of the chips 810.

In the present embodiment, the chips 810 are not electrically connected by wire bonding or by forming a through-silicon via (TSV) on the chips 810. The chips 810 are electrically connected by the vertical conductive line 860 disposed at the outside of the projection area of the chips 810. Therefore, the horizontal distance and the vertical distance between the chips 810 can be reduced, and the current path of the vertical conductive line 860 can be reduced.

Referring to FIG. 1, the chip stack structure 800 further includes a plurality of insulating films 830. Each chip 810 is disposed in one of the insulating films 830. The number of the chips 810 disposed in one of the insulating film 830 can be one or more than one. For example, in stack S81, one chip 810 is disposed in the insulating film 830; in stack S82, two chips 810 are disposed in the insulating film 830; in stack S85, one chip 810 is disposed in the insulating film 830.

The material of the insulating films 830 can be silicon oxide. For example, the insulating film 830 can be a prepared glass film. The chip stack structure 800 further comprises a plurality of adhering layers 820. The adhering layers 820 are used for adhering the insulating films 830. That is to say, the insulating film 830 is not formed by any semiconductor process. The insulating film 830 can be quickly adhered to the other insulating film 830 without any other process.

In one embodiment, the thickness of the insulating films 830 can be substantially equal. The thickness of the insulating film 830 can be equal to or larger than that of the chip 810, such that each stack is easy to keep flat.

In order to electrically connecting some of the chips 810, the vertical conductive line 860 penetrates some of the insulating films 830. For example, in the stack S81 and the stack S82, the vertical conductive line 860 at least penetrates the lower insulating film 830 in the stack S82, the upper insulating film 830 in the stack S81 and the lower insulating film 830 in the stack S81.

The chip stack structure 800 further comprises a plurality of horizontal conductive lines 840. Each horizontal conductive line 840 is disposed in one of the insulating films 830, and each horizontal conductive line 840 connects one of the chips 810 and the vertical conductive line 860. In each stack, the horizontal conductive line 840 and the chip 810 are disposed in different insulating films 830.

In each stack, the thickness of the stack can be minimized to the sickness of two insulating films 830 and two adhering layers 820. Therefore, the thickness of the chip stack structure 800 can be reduced.

In one embodiment, the chip stack structure 800 can further comprises a heatsink 870. The heatsink 870 is disposed in one of the insulating films 830. For example, as shown in the stack S83 of FIG. 1, the heatsink 870 of stack S83 is disposed in the insulating film 830 and contacts with the chip 810 in stack S82. Therefore, the heat generated from the chip 810 of stack S82 can be quickly dismissed.

In one embodiment, the chip stack structure 800 can further comprises a fluid 880. The fluid 880 is disposed in one of the insulating films 830. For example, as shown in the stack S84 of FIG. 1, the fluid 880 is disposed in a plurality of channels 881 which are hollow. Therefore, the heat generated from the chips 810 can be quickly dismissed by the fluid 880.

Figure 2A:
FIGS. 2A to 2T show a manufacturing method of the chip stack structure.
Figure 2B:
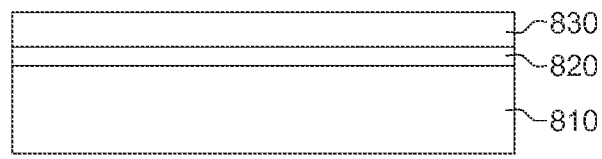
Figure 2C:
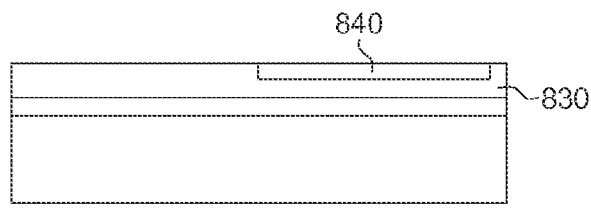
Figure 2D:
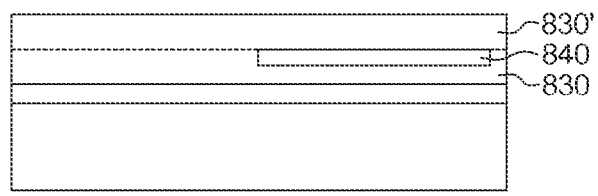
Figure 2E:
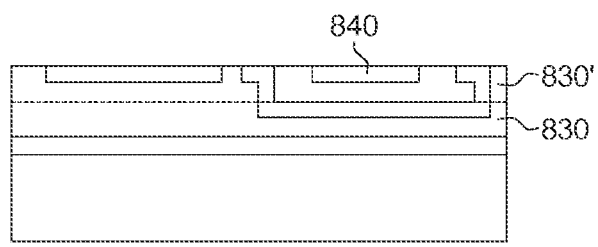
Figure 2F:
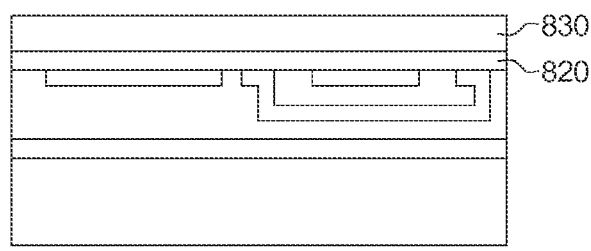
Figure 2G:
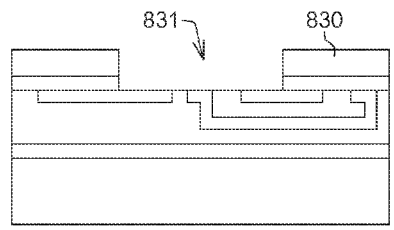
Figure 2H:
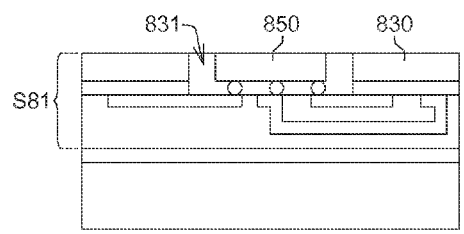
Figure 2I:
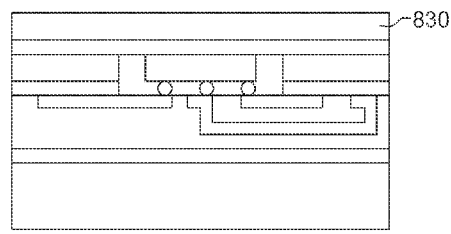
Figure 2J:
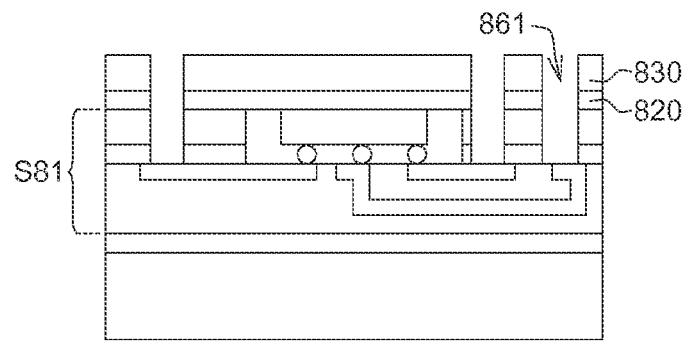
Figure 2K:
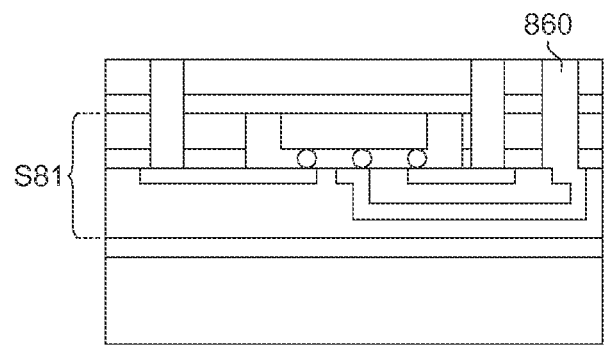
Figure 2L:
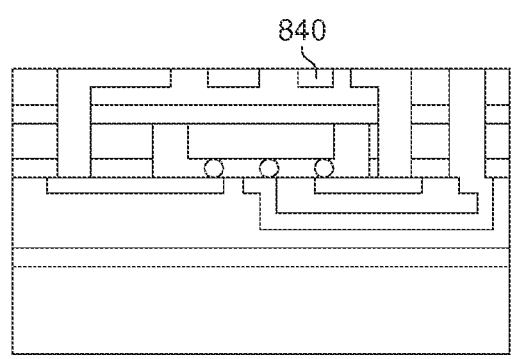
Figure 2M:
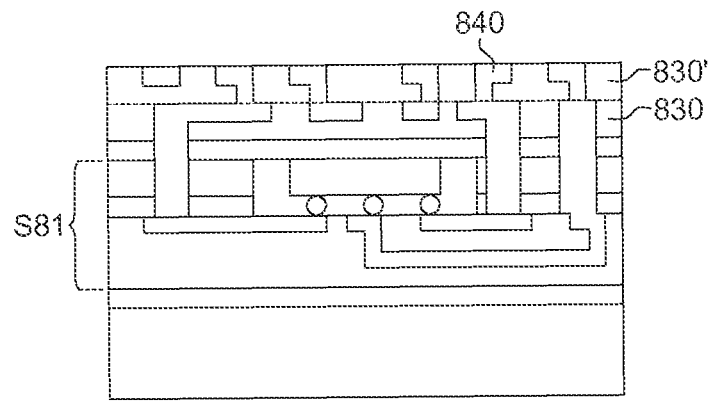
Figure 2N:
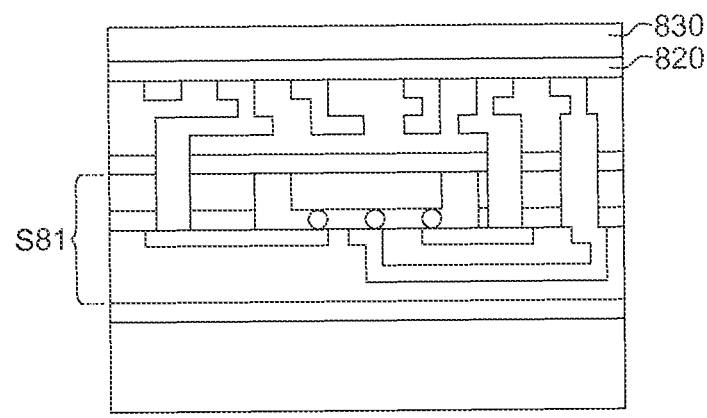
Figure 2O:
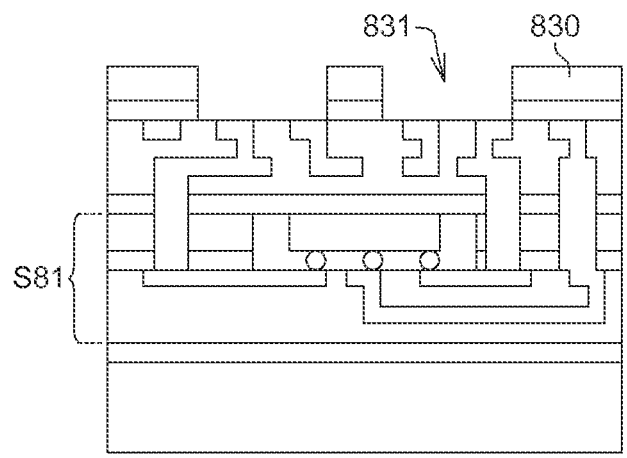
Figure 2P:
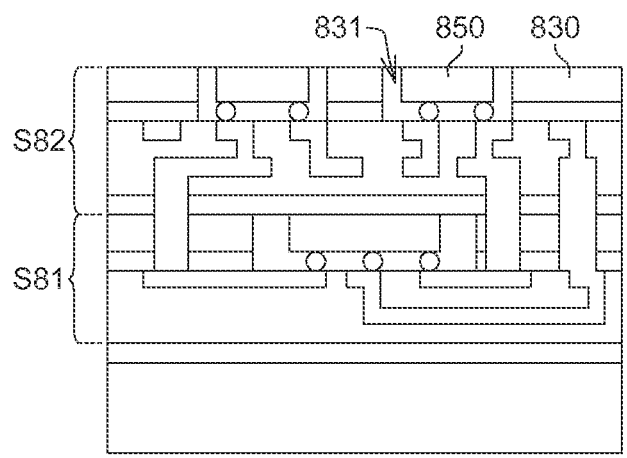
Figure 2Q:
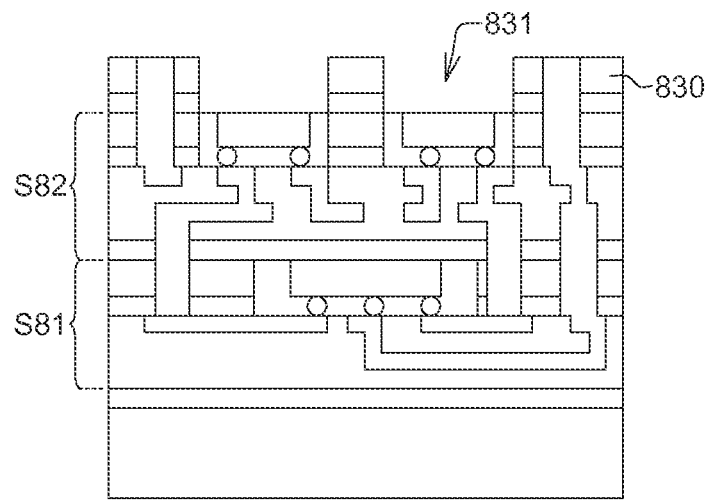
Figure 2R:
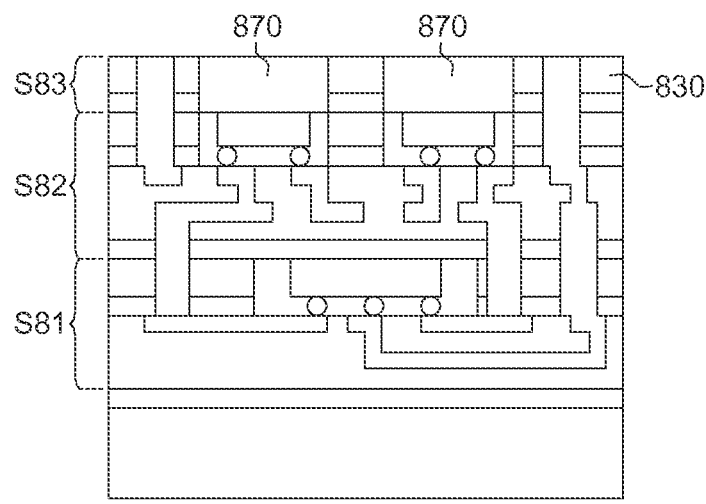
Figure 2S:
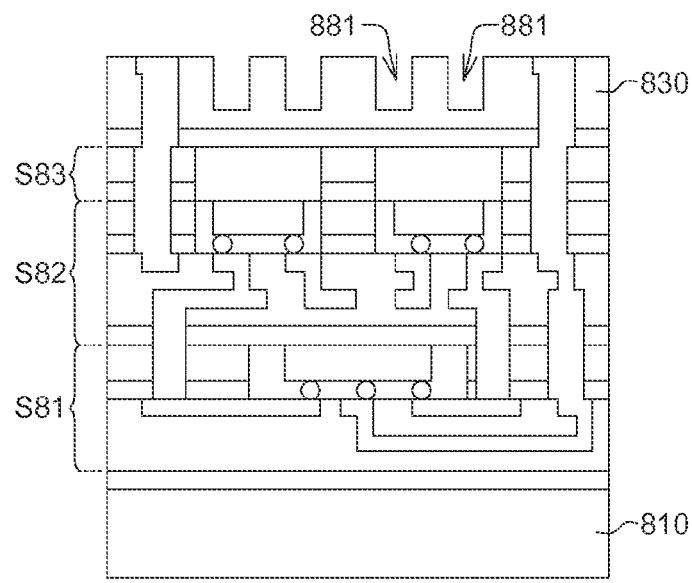
Figure 2T:
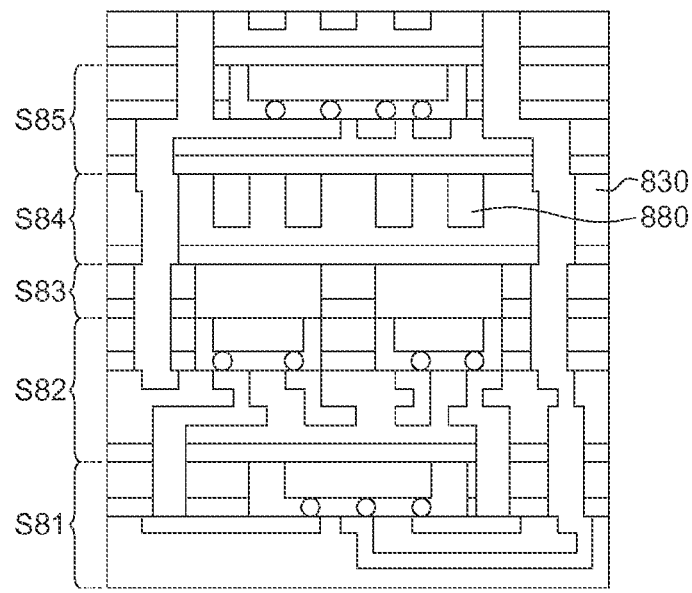

Furthermore, please referring to FIGS. 2A to 2T, a manufacturing method of the chip stack structure 800 is shown. In FIG. 2A, a carrier 810 is provided. The material of the carrier 810 can be silicon or silicon oxide.

In FIG. 2B, one insulating film 830 is adhered to the carrier 810 via the adhering layer 820 without any semiconductor process.

In FIG. 2C, part of one horizontal conductive line 840 is disposed in the insulating film 830. Because the insulating film 830 is flat, the insulating film 830 is easy to etched and filled in a conductive material.

In FIG. 2D, a SOG material 830' is formed on the insulating film 830. Because the insulating film 830 is flat, the SOG material 830' is easy to be coated with a flat surface.

In FIG. 2E, part of the horizontal conductive line 840 is disposed in the SOG material 830'.

In FIG. 2F, another insulating film 830 is adhered to the insulating film 830 where the horizontal conductive line 840 is disposed without any semiconductor process.

In FIG. 2G, an opening 831 is formed in the insulating film 830. Because the insulating film 830 is flat, the etched depth is easy to be controlled.

In FIG. 2H, one chip 810 is disposed in the opening 831 and a filling material is filled in the opening 831. Thereafter, the stack S81 is formed.

In FIG. 2I, another insulating film 830 is adhered to the insulating film 830 where the chip 810 is disposed.

In FIG. 2J, the top two insulating films 830 are etched to form a vertical hole 861.

In FIG. 2K, a conductive material is filled in the vertical hole 861 to form the vertical conductive line 860.

In FIG. 2L, part of the horizontal conductive line 840 is formed in the top insulating film 830.

In FIG. 2M, a SOG material 830' is formed on the insulating film 830 and part of the horizontal conductive line 840 is disposed in the SOG material 830'.

In FIGS. 2N to 2P, similar process is proceed to form the stack S82. In the stack S82, two chips 810 are disposed in one insulating film 830.

In FIGS. 2Q to 2R, similar process is proceed to form the stack S83. In the stack S83, two heat sinks 870 are disposed in one insulating film 830.

In FIGS. 2S to 2T, similar process is proceed to form the stacks S84 and S85. In the stack S84, the channels 881 which are hollow are formed in one insulating film 830, and fluid 880 is disposed in the channels 881. In stack S85, one chip 810 is disposed in one insulating film 830.

Figure 3:
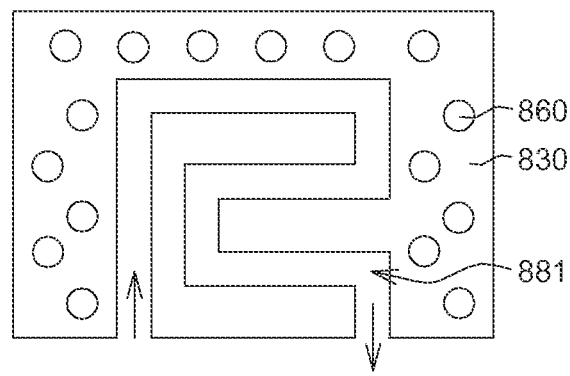
FIGS. 3 and 4 show two kinds of channel.
Figure 4:
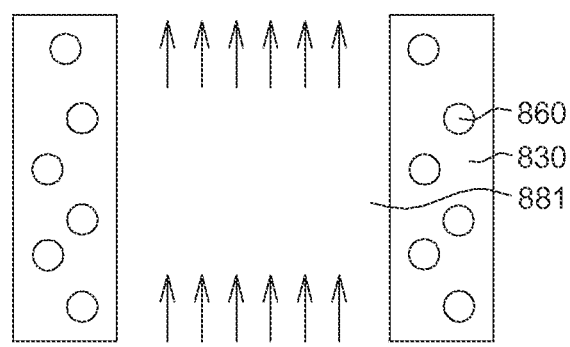

Please referring to FIGS. 3 and 4, two kinds of channel 881 are shown. In FIG. 3, the channel 881 can be wiggly. In FIG. 4, the channel 881 can be straight.

In general, 1 calorie thermal energy will increase the chip stack structure 800 1. Since 1 joule equals to 0.454 calorie, if the power consumption is 1 W (1 J/sec) and the fluid flow rate is 1 CC/sec, then the temperature will be increased 0.45. If the increasing amount of the temperature is set to be lower than 45, then the fluid flow rate must be larger than $10^{-2}$ CC/sec-W. If the fluid flow speed is set to be lower then 100 cm/sec to prevent any damage, then the cross-section area of the channel 881 must be larger than $10^{-4}$ cm$^2$/W (i.e. $10^4$ um$^2$/W).

Second Embodiment

Figure 5:
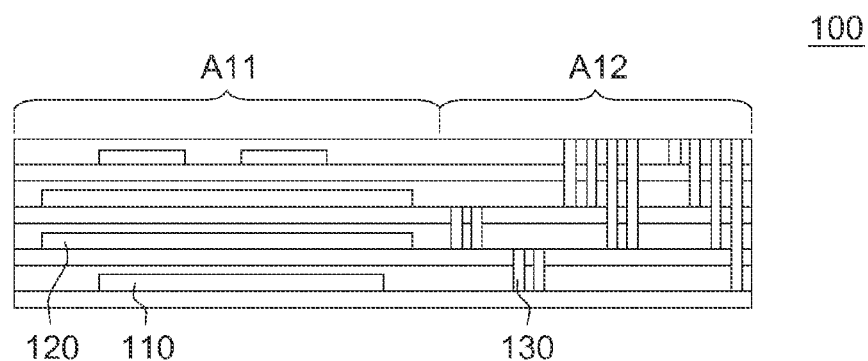
FIG. 5 shows a chip stack structure.

Please referring to FIG. 5, a chip stack structure 100 is shown. The chip stack structure 100 includes at least two chips, such as a first chip 110 and a second chip 120, and at least a vertical conductive line, such as vertical conductive line 130. The second chip 120 is disposed above the first chip 110. The vertical conductive line 130 is electrically connected to the first chip 110 and the second chip 120. The vertical conductive line 130 is disposed at the outside of a projection area of the first chip 110 and the second chip 120.

In the present embodiment, the first chip 110 and the second chip 120 is not electrically connected by wire bonding or by forming a through-silicon via (TSV) on the first chip 110 or the second chip 120. In the present embodiment, the first chip 110 and the second chip 120 are electrically connected by the vertical conductive line 130 disposed at the outside of the projection area of the first chip 110 and the second chip 120. Referring to FIG. 1, the first chip 110 and the second chip 120 are disposed at a chip area A11, and the vertical conductive line 130 is disposed at a line area A12. The line area A12 can be four edges or one edge of the chip stack structure 100. The vertical conductive line 130 is disposed at outside of the chip area A11, such that the first chip 110 and the second chip 120 can be gathered at the chip area A11. Therefore, the horizontal distance and the vertical distance between the first chip 110 and the second chip 120 can be reduced, and the current path of the vertical conductive line 130 can be reduced.

Figure 6:
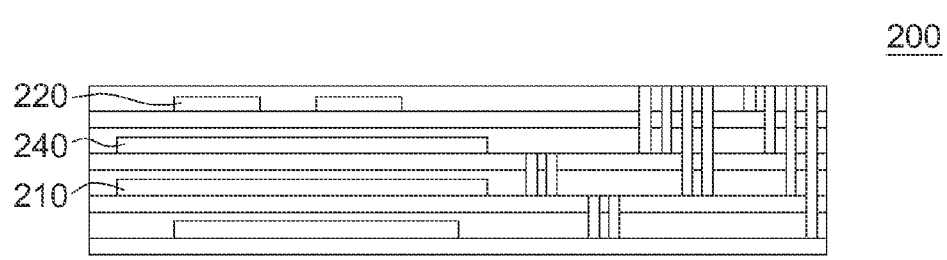
FIG. 6 shows another chip stack structure.

Please referring to FIG. 6, another chip stack structure 200 is shown. A heat sink plate 240 can be disposed between the first chip 210 and the second chip 220. The heat sink plate 240 can diffuse the heat while the first chip 210 and the second chip 220 are working. The heat sink plate 240 can be an aluminum plate or a casing including fluid.

Figure 7:
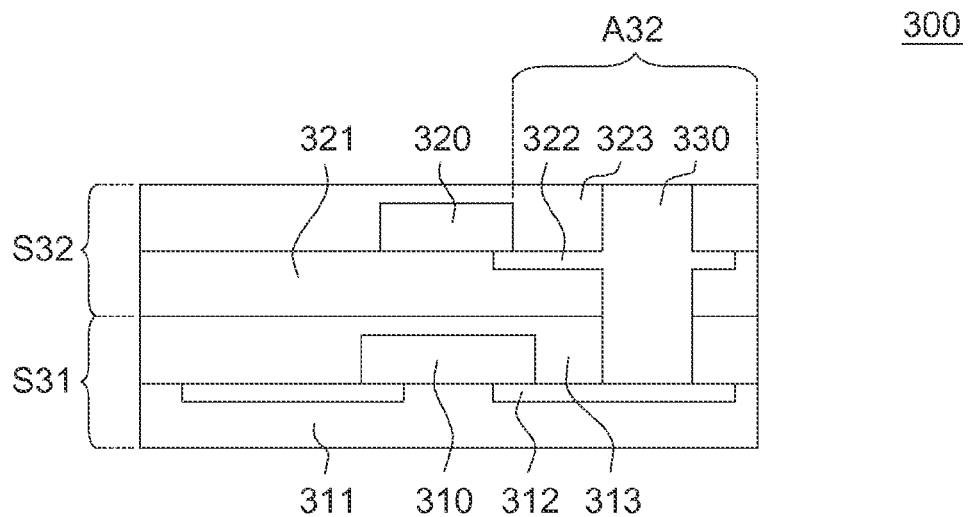
FIG. 7 shows two stacks of another chip stack structure in detail.

Please referring to FIG. 7, two stacks S31, S32 of another chip stack structure 300 are shown. The chip stack structure 300 includes a first chip 310, a first substrate 311, a first horizontal conductive line 312, a first insulating layer 313, a second chip 320, a second substrate 321, a second horizontal conductive line 322, a second insulating layer 323 and a vertical conductive line 330. The chips stack structure 300 can includes more than two stacks. In FIG. 3, two stacks S31, S32 are shown for example. The first chip 310, the first substrate 311, the first horizontal conductive line 312 and the first insulating layer 313 form the bottom stack S31. The second chip 320, the second substrate 321, the second horizontal conductive line 322 and the second insulating layer 323 form the bottom stack S32. Other stacks similar to the stacks S32 can be disposed above the stack S31.

The first chip 310 and the second chip 320 can be microprocessor, memory, radio frequency chip, display chip or MEMS, for example. The first chip 310 and the second chip 320 can be the same kinds of chips or different kinds of chips. The size of the first chip 310 and the second chip 320 can be the same or different.

The first substrate 311 and the second substrate 321 are used for carrying varied electric components, such as the first chip 310 and the second chip 320. The material of the first substrate 311 and the second substrate 321 can be silicon, polymer or silicon oxide. The first chip 310 is disposed on the first substrate 311, and the second chip 320 is disposed on the second substrate 321.

The first horizontal conductive line 312 and the second horizontal conductive line 322 are used for transmitting electric signal. The material of the first horizontal conductive line 312 and the second horizontal conductive line 322 can be Cu, Ag, Ag or Al, for example. The first horizontal conductive line 312 is disposed in the first substrate 311, and the second horizontal conductive line 322 is disposed in the second substrate 321. The first horizontal conductive line 312 connects the first chip 310 and the vertical conductive line 330, and the second horizontal conductive line 322 connects the second chip 320 and the vertical conductive line 330. The first horizontal conductive line 312 and the second horizontal conductive line 322 can be exposed at the surfaces of the first substrate 311 and the second substrate 321 respectively. Or, the first horizontal conductive line 312 and the second horizontal conductive line 322 can be partially embedded in the first substrate 311 and the second substrate 321 respectively, and extend to the surfaces of the first substrate 311 and the second substrate 321.

The first insulating layer 313 covers the first substrate 311 and the first chip 310. The second insulating layer 323 covers the second substrate 321 and the second chip 320. The material of the first insulating layer 313 and the second insulating layer 323 can be polymer or silicon oxide. The first insulating layer 313 and the second insulating layer 323 are used for protecting the first chip 310 and the second chip 320. Moreover, the surface of the first insulating layer 313 is flat, such that the second substrate 321 can be stably stacked on the first insulating layer 313. The second insulating layer 323 is flat too, such that other substrate can be stably stacked on the second insulating layer 323.

The material of the first substrate 311, the second substrate 321, the first insulating layer 313 and the second insulating layer 323 can be the same. For example, the material of those elements can be polymer, or the material of those elements can be silicon oxide. Or, the material of the first substrate 311, the second substrate 321, the first insulating layer 313 and the second insulating layer 323 can be different. For example, the material of the first substrate 311 can be silicon, the material of the second substrate 321 can be silicon oxide, and the first insulating layer 313 and the second insulating layer 323 can be polymer.

The vertical conductive line 330 penetrates the second insulating layer 323, the second substrate 321 and the first insulating layer 313, but the vertical conductive line 330 does not penetrate the first substrate 311. The first horizontal conductive line 312 and the second horizontal conductive line 322 are both extend to the line area A32. The vertical conductive line 330 penetrates the line area A32 and connects the first horizontal conductive line 312 and the second horizontal conductive line 322 for electrically connecting the first chip 310 and the second chip 320.

Moreover, referring to FIG. 7, the size of the first substrate 311 is substantially equal to that of the second substrate 321, the first insulating layer 313 and the second insulating layer 323. The size of the first chip 310 can be different from that of the second chip 320. No matter the size of the first chip 310 and the size of the second chip 320, the size of the chip stack structure 300 can be fixed.

Figure 8A:
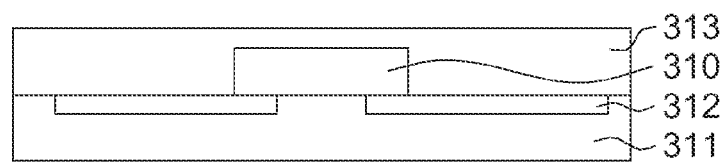
FIGS. 8A to 8D show a manufacturing method of a chip stack structure.
Figure 8B:
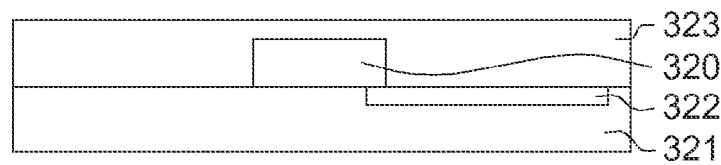
Figure 8C:
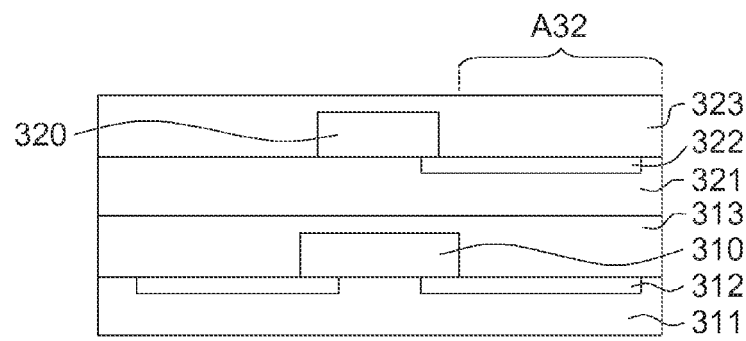
Figure 8D:
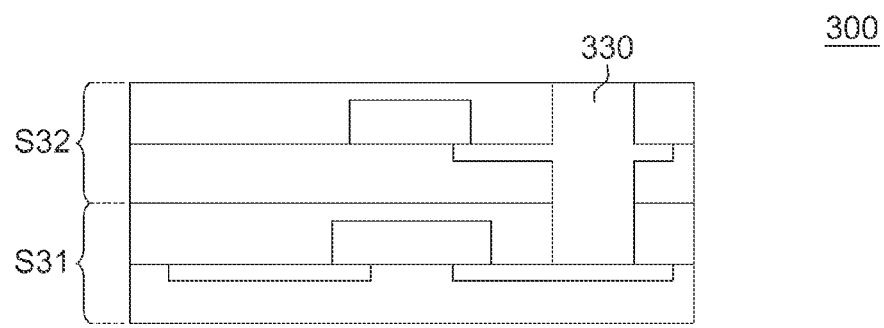

Furthermore, please referring to FIGS. 8A to 8D, a manufacturing method of the chip stack structure 300 is shown. As shown in FIG. 8A, the first chip 310 is provided. As shown in FIG. 8B, the second chip 320 is provided. As shown in FIG. 8C, the first chip 310 and the second chip 320 are stacked. As shown in FIG. 8D, the vertical conductive line 330 is formed for electrically connecting the first chip 310 and the second chip 320. The vertical conductive line 330 is disposed at the outside of the projection area of the first chip 310 and the second chip 320.

Figure 9:
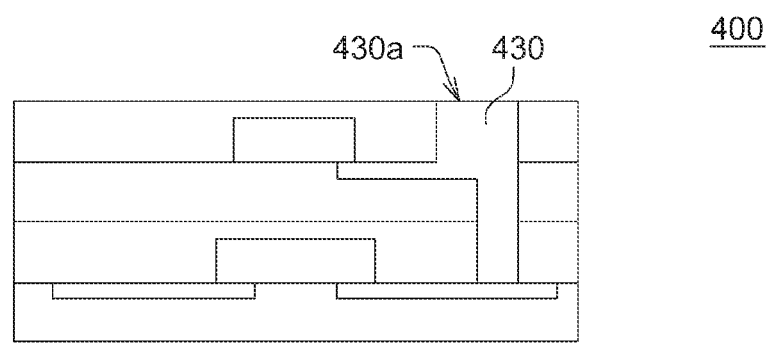
FIG. 9 shows another chip stack structure.

Please referring to FIG. 9, another chip stack structure 400 is shown. In the step of forming the vertical conductive line 430, a vertical hole 430a whose width is not the same at different locations is formed by more than one steps. Therefore, the width of the vertical conductive line 430 can be different at different locations.

Figure 10:
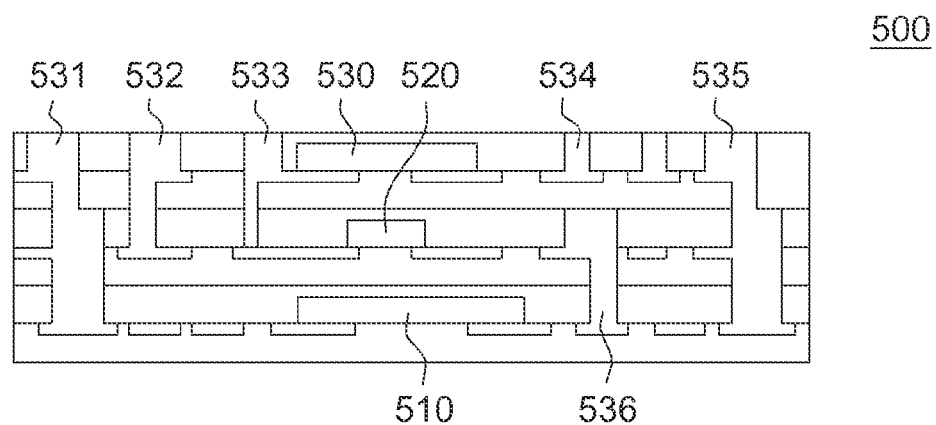
FIG. 10 shows another chip stack structure.

Please referring to FIG. 10, another chip stack structure 500 is shown. In one application, the chip stack structure 500 includes several vertical conductive lines 531, 532, 534, 535, 536. The vertical conductive line 531 can be a data line of the first chip 510, the second chip 520 and the third chip 530; the vertical conductive line 532 can be a power line of the second chip 520; the vertical conductive line 533 can be a data line of the second chip 520 and the third chip 530; the vertical conductive line 534 can be a power line of the third chip 530; the vertical conductive line 535 can be a power line of the first chip 510; the vertical conductive line 536 can be a data line of the first chip 510 and the second chip 520.

Third Embodiment

Figure 11:
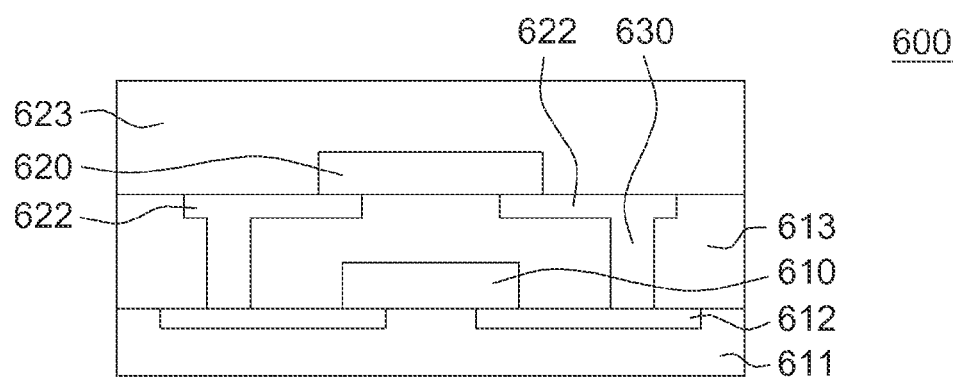
FIG. 11 shows another chip stack structure.

Please referring to FIG. 11, another chip stack structure 600 is shown. The chip stack structure 600 of the present embodiment is different from the chip stack structure 300 in that only one substrate 611 is used, other similarities would not be repeated. The chip stack structure 600 includes a substrate 611, a first horizontal conductive line 612, a first chip 610, a first insulating layer 613, a second horizontal conductive line 622, a second chip 620, a second insulating layer 623 and a vertical conductive line 630.

The second chip 620 is disposed on the first insulating layer 613. The first horizontal conductive line 612 is disposed in the substrate 611. The second horizontal conductive line 622 is disposed in the first insulating layer 613. The vertical conductive line 630 connects the first horizontal conductive line 612 and the second horizontal conductive line 622.

Figure 12A:
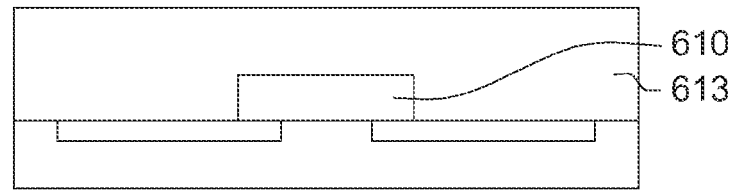
FIGS. 12A to 12F show a manufacturing method of the chip stack structure of FIG. 11.

Please referring to FIGS. 12A to 12F, a manufacturing method of the chip stack structure 600 of FIG. 11 is shown. Referring to FIG. 12A, the first chip 610 is provided. Referring to FIGS. 12B to 12F, the second chip 620 is stacked on the first chip 610 and the vertical conductive line 630 is formed.

In detail, referring to FIG. 12A, the steps of FIG. 12A are similar to the steps of FIG. 4A and do no be repeated.

Figure 12B:
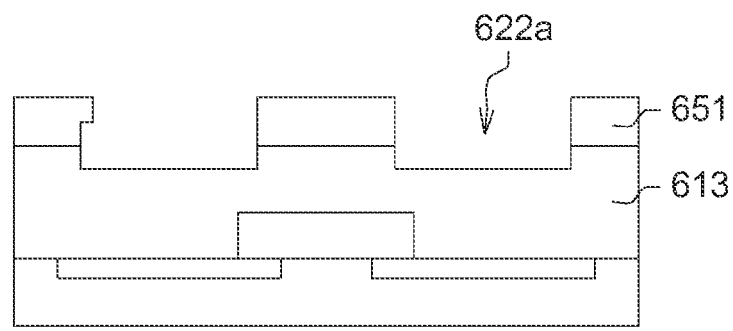

Then, referring to FIG. 12B, the first insulating layer 613 is etched to form a concave 622a by taking a patterned photo-resister layer 651 as a mask.

Figure 12C:
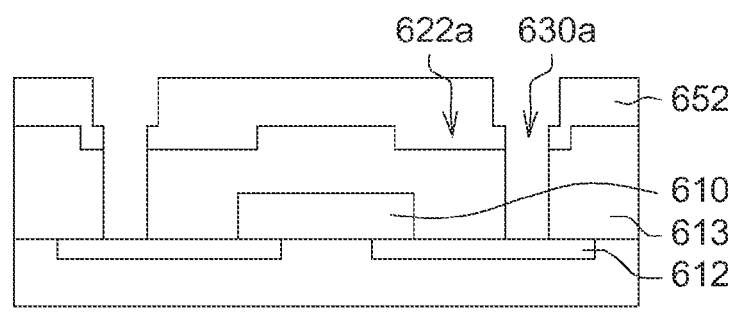

Afterwards, referring to FIG. 12C, the first insulating layer 613 is etched to form a vertical hole 630a by taking another patterned photo-resister layer 652 as a mask.

Figure 12D:
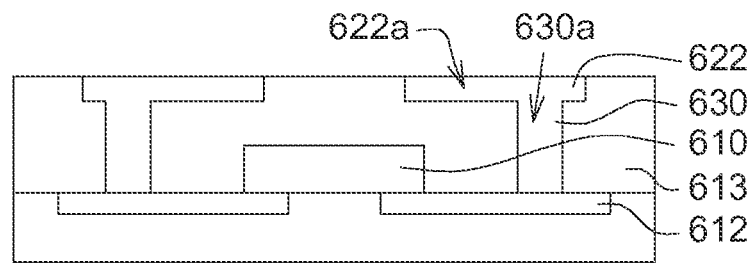

Then, referring to FIG. 12D, the vertical conductive line 630 and the second horizontal conductive line 622 are formed in the vertical hole 630a and the concave 622a respectively. The second horizontal conductive line 622 is disposed at the surface of the first insulating layer 613. The vertical conductive line 630 connects the first horizontal conductive line 612 and the second horizontal conductive line 622.

Figure 12E:
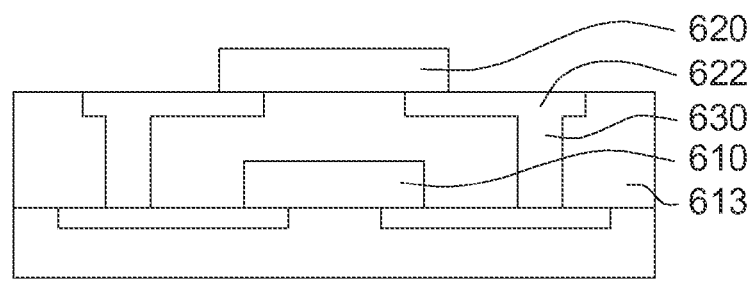

Afterwards, referring to FIG. 12E, the second chip 620 is disposed on the first insulating layer 613, such that the second chip 620 electrically connects to the second horizontal conductive line 622.

Figure 12F:
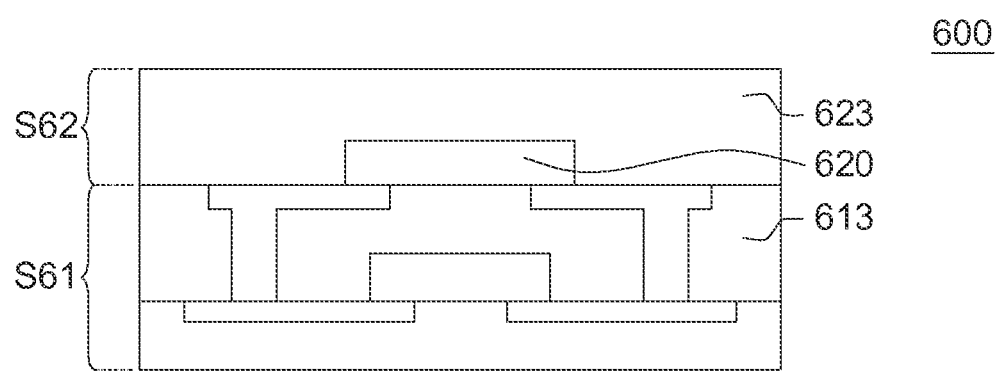

Then, referring to FIG. 12F, the second insulating layer 623 is formed to cover the first insulating layer 613 and the second chip 620.

Another chip stack structure 600 can be formed by the steps of FIGS. 12A to 12F. Only two stacks S61, S62 are taken as an example in FIGS. 12A to 12F. However, more than two stacks can be formed by the similar steps.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip stack structure, comprising:
    a plurality of chips, wherein the chips are overlapped;
    a vertical conductive line, electrically connected to some of the chips, wherein the vertical conductive line is disposed at the outside of a projection area of some of the chips;
    a plurality of insulating films, wherein each chip is disposed in one of the insulating films, and a plurality of channels which are hollow are formed in one of the insulating films; and
    a fluid, disposed in the channels.
2. The chip stack structure according to claim 1, further comprising:
    a plurality of horizontal conductive lines, wherein each horizontal conductive line is disposed in one of the insulating films, and each horizontal conductive line connects one of the chips and the vertical conductive line.
3. The chip stack structure according to claim 1, wherein the material of the insulating films is silicon oxide.
4. The chip stack structure according to claim 1, further comprising:
    a plurality of adhering layers, for adhering the insulating films.
5. The chip stack structure according to claim 1, wherein the vertical conductive line penetrates some of the insulating films.
6. The chip stack structure according to claim 1, wherein the thicknesses of the insulating films are substantially equal.
7. The chip stack structure according to claim 1, further comprising:
    a heatsink, disposed in one of the insulating films.
8. A manufacturing method of a chip stack structure, comprising:
    providing a carrier;
    providing a plurality of chips;
    forming a vertical conductive line, wherein the vertical conductive line is disposed at the outside of a projection area of one of the chips;
    stacking the chips, the vertical conductive line electrically connecting some of the chips;
    providing a plurality of insulating films, wherein one of the insulating films is disposed on the carrier, each chip is disposed in one of the insulating films;
    forming a plurality of channels which are hollow in one of the insulating films; and
    disposing a fluid in the channels.
9. The manufacturing method of the chip stack structure according to claim 8, further comprising:
    forming a plurality of horizontal conductive lines, each horizontal conductive line is disposed in one of the insulating films.
10. The manufacturing method of the chip stack structure according to claim 8, wherein one of the insulating films is adhered to the carrier and others of the insulating films are adhered to each other.
11. The manufacturing method of the chip stack structure according to claim 8, further comprising:
    etching some of the insulating films to form a vertical hole; and
    filling a conductive material in the vertical hole to form the vertical conductive line.
12. The manufacturing method of the chip stack structure according to claim 8, wherein the thicknesses of the insulating films are substantially equal.
13. The manufacturing method of the chip stack structure according to claim 8, further comprising:
    disposing a heatsink in one of the insulating films.

* * * * *